(12) United States Patent
Seo et al.

(10) Patent No.: US 7,709,101 B2
(45) Date of Patent: *May 4, 2010

(54) ORGANIC ELECTROLUMINESCENCE DEVICE

(75) Inventors: Jeong Dae Seo, Gwacheon-si (KR); Chun Gun Park, Seoul (KR); Hyun Cheol Jeong, Jinju-si (KR); Kyung Hoon Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/028,734

(22) Filed: Jan. 5, 2005

(65) Prior Publication Data

US 2005/0146268 A1    Jul. 7, 2005

(30) Foreign Application Priority Data

Jan. 6, 2004    (KR) ...................... 10-2004-0000624

(51) Int. Cl.
*H01J 1/62* (2006.01)
(52) U.S. Cl. .................. 428/690; 428/917; 313/504; 313/506
(58) Field of Classification Search ................ 428/690, 428/917; 313/504, 506; 252/301.16
See application file for complete search history.

(56) References Cited

U.S. PATENT DOCUMENTS

| | | | | |
|---|---|---|---|---|
| 5,077,142 A | * | 12/1991 | Sakon et al. | 428/690 |
| 5,536,949 A | * | 7/1996 | Hosokawa et al. | 257/40 |
| 5,635,308 A | * | 6/1997 | Inoue et al. | 428/696 |
| 5,645,948 A | * | 7/1997 | Shi et al. | 428/690 |
| 5,766,779 A | * | 6/1998 | Shi et al. | 428/690 |
| 6,830,829 B2 | * | 12/2004 | Suzuki et al. | 428/690 |
| 7,052,351 B2 | * | 5/2006 | Tutt et al. | 445/24 |
| 2002/0177009 A1 | | 11/2002 | Suzuki et al. | 428/690 |
| 2004/0209118 A1 | * | 10/2004 | Seo et al. | 428/690 |
| 2005/0175857 A1 | * | 8/2005 | Coggan et al. | 428/690 |

FOREIGN PATENT DOCUMENTS

| | | |
|---|---|---|
| EP | 1167488 A1 | 1/2002 |
| EP | 1253151 A1 | 10/2002 |
| EP | 1437395 A2 | 7/2004 |
| JP | 2002-329580 | 11/2002 |
| JP | 2003-45664 | 2/2003 |
| JP | 2003-297580 | 10/2003 |
| JP | 2004-091444 * | 3/2004 |
| WO | WO 0121729 A | 3/2001 |

OTHER PUBLICATIONS

EP Office Action dated May 2, 2005.

* cited by examiner

*Primary Examiner*—D. L Tarazano
*Assistant Examiner*—Camie S Thompson
(74) *Attorney, Agent, or Firm*—Holland & Knight LLP

(57) ABSTRACT

An organic electroluminescence device is disclosed which comprises an emitting layer and a hole blocking layer disposed between an electron injecting electrode (cathode) and a hole injecting electrode (anode), the material for the hole blocking layer being expressed by the following chemical formula 1:

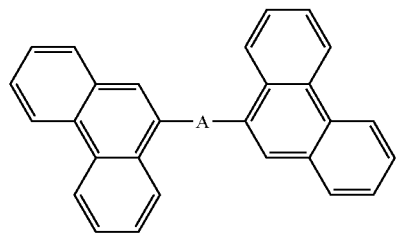

The organic electroluminescence device can improve the luminescence and driving characteristics.

4 Claims, No Drawings

ORGANIC ELECTROLUMINESCENCE DEVICE

This application claims the benefit of the Korean Patent Application No. 10-2004-0000624, filed on Jan. 6, 2004, which is hereby incorporated by reference as if fully set forth herein.

BACKGROUND OF THE INVENTION

1. Field of the Invention

The present invention relates to an organic electroluminescence device.

2. Background of the Related Art

With the recent trend of a display device's growing in size, the need for a flat display device occupying a small space is increasing. As one of such flat display devices, the technology of organic electroluminescence device, known as an organic light emitting diode (OLED), has been developed rapidly, and a variety of sample products have been already released.

An organic electroluminescence device includes an organic film which is formed between an electron injecting electrode(cathode) and a hole injecting electrode(anode), and emits light generated upon extinction after electrons and holes are paired. The device can be formed on a flexible transparent substrate, such as plastic, can be driven at a lower voltage (below 10V) than a plasma display panel or inorganic electroluminescence(EL) display is, has relatively low power consumption, and has a superior color sense. Further, the organic electroluminescence(EL) device can represent three colors of green, blue and red, and thus is drawing a great deal of attention as a next-generation full-color display device.

Here, the procedure of fabricating an organic electroluminescence device will be described briefly.

(1) Firstly, an anode material is coated on a transparent substrate. Indium tin oxide(ITO) is often used as the anode material.

(2) A hole injecting layer(HIL) is coated thereon. Copper phthalocyanine(CuPC) is mainly used as the hole injecting layer at a thickness of 10 to 30 nm.

(3) Then, a hole transport layer(HTL) is coated. 4.4'-bis[N-(1-naphthyl)-N-phentylamino]-biphenyl(NPB) is deposited and coated at 30 to 60 nm as the hole transport layer.

(4) An organic emitting layer is formed thereon. At this moment, a dopant is added thereto as needed. In case of green luminescence, tris(8-hydroxy-quinolate)aluminum(Alq3) is deposited at a thickness of 30 to 60 nm as the organic emitting layer, and MQD(N-methyl quinacridone) is commonly used as the dopant.

(5) An electron transport layer(ETL) or electron injecting layer(EIL) are consecutively coated thereon, or an electron injecting transport layer is formed thereon. In case of green luminescence, Alq3 of the above (4) has a good electron transport capability, and thus it is often the case that no electron injecting/transport layer is used.

(6) Next, a cathode is coated, and finally a protecting layer is coated.

In the above structure, blue, green and red light emitting devices each can be realized depending on how a light emitting layer is formed.

The organic electroluminescence device forms excitons by the combination of holes from the hole transport layer and electrons from the electron transport layer. At this time, the excitons are protons that conduct heat without being accompanied by the movement of an electric charge in a semiconductor or insulating body.

The excitons thus generated are dispersed a relatively long distance before extinction, and thus increases the possibility of some parts of the excitons being dispersed out of the light emitting layer. In some cases, the excitons are dispersed and quenched by the anode. To reduce this phenomenon, a hole blocking layer is used which can disperse electrons, substantially support the dispersion of excitons, and substantially prevent the dispersion of holes.

However, the hole blocking layer according to the prior art is low in stability, and thus is unable to prevent the quenching of the excitons to a satisfying level.

SUMMARY OF THE INVENTION

Accordingly, the present invention is directed to an organic electroluminescence device that substantially obviates one or more problems due to limitations and disadvantages of the related art.

An object of the present invention is to provide an organic electroluminescence device which is suitable for phosphorescence and excellent in luminance and driving characteristics by comprising a hole blocking layer having an excellent stability disposed between an electron injecting electrode (cathode) and a hole injecting electrode (anode).

The organic electroluminescence device of the present invention comprises an anode, a hole injecting layer, a hole transport layer, an emitting layer, a hole blocking layer, an electron transport layer, an electron injecting layer and a cathode, the material for the hole blocking layer is expressed by the following chemical formula 1:

Chemical formula 1

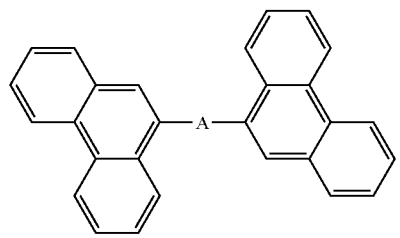

DETAILED DESCRIPTION OF THE PREFERRED EMBODIMENTS

Additional advantages, objects, and features of the invention will be set forth in part in the description which follows and in part will become apparent to those having ordinary skill in the art upon examination of the following or may be learned from practice of the invention.

The organic electroluminescence device of the present invention comprises an anode, a hole injecting layer, a hole transport layer, an emitting layer, a hole blocking layer, an electron transport layer, an electron injecting layer and a cathode, the material for the hole blocking layer is expressed by the following chemical formula 1:

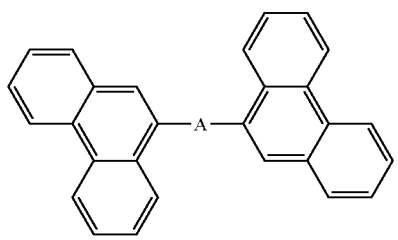

wherein A is selected from the group consisting of a substituted or non-substituted aromatic group, a hetero ring group, a substituted or non-substituted phenyl, biphenyl, pyridyl, bipyridyl, napthyl, binaphthyl, quinoline, isoquinoline, anthracene, phenanthraene and the like. The substituent on the substituted aromatic group or hetero ring group is selected from the group consisting of alkyl, allyl, alkoxy, halogene, cyano and the like, or the group consisting of methyl, ethyl, isopropyl, phenyl, naphtyl, methoxy, ethoxy, fluoro, chloro, cyano and the like.

A is expressed by one of the following chemical formulae 2:

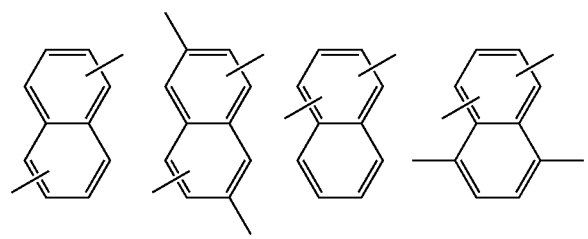

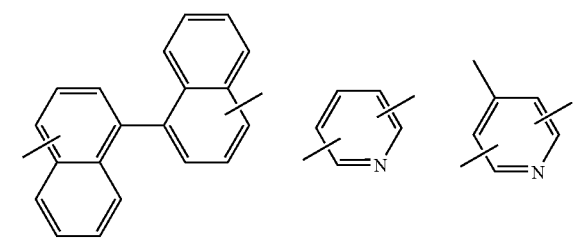

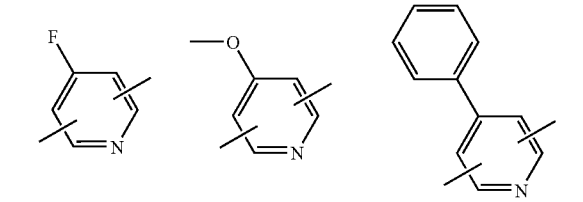

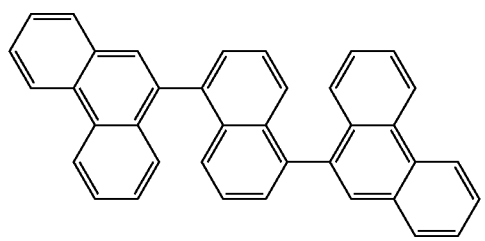
BL-12

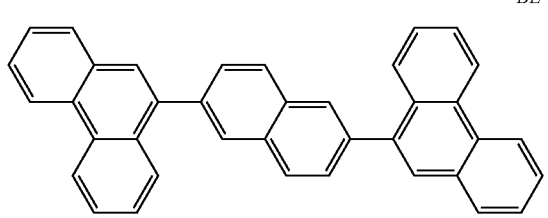
BL-13

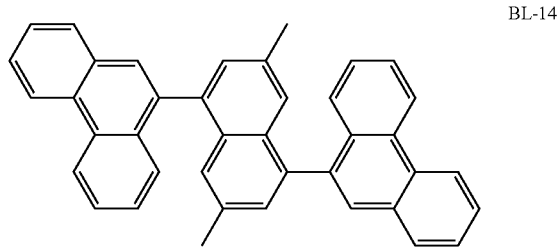
BL-14

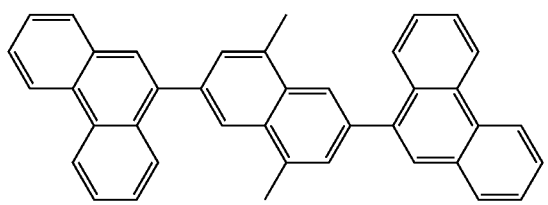
BL-15

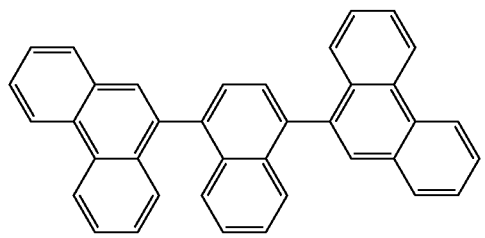
BL-16

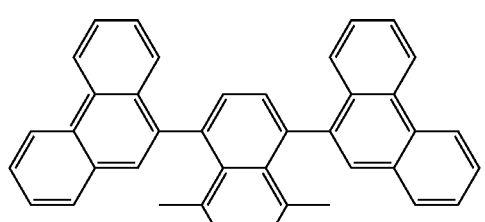
BL-17 and the material for the hole blocking layer is expressed by one of the following chemical formulae 3:

BL-18
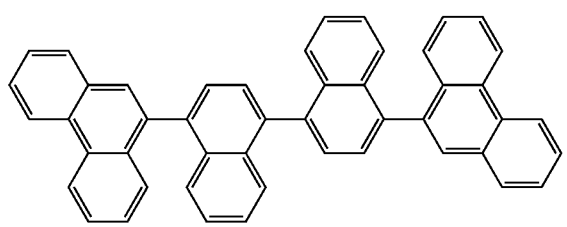
BL-19
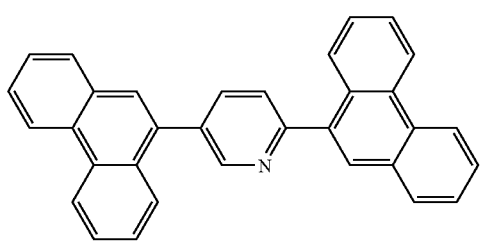
BL-20
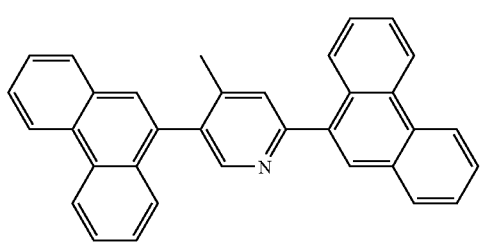
BL-21
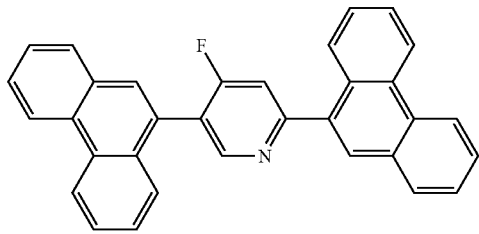
BL-22
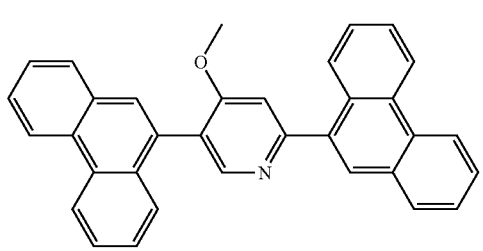
BL-23
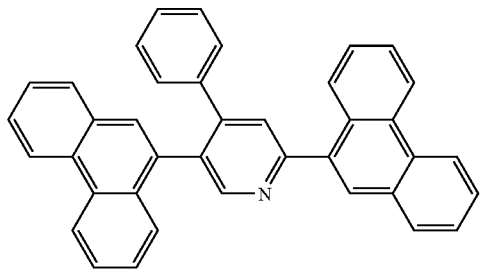
BL-24
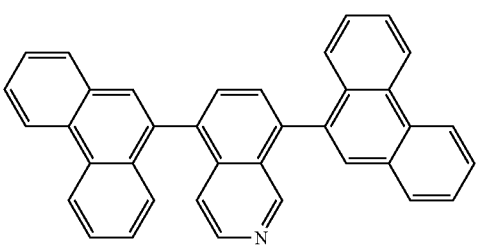
BL-25
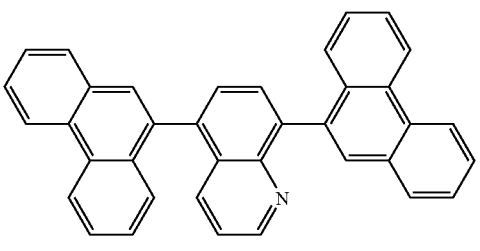
BL-26
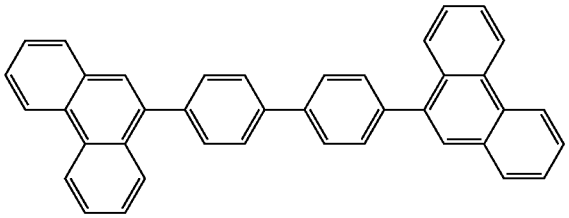
BL-27
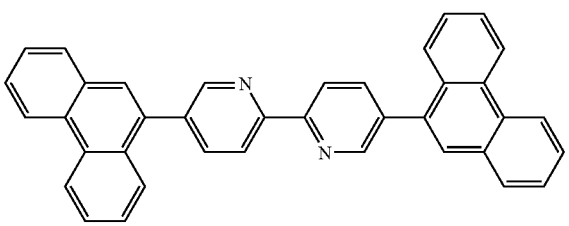
BL-28
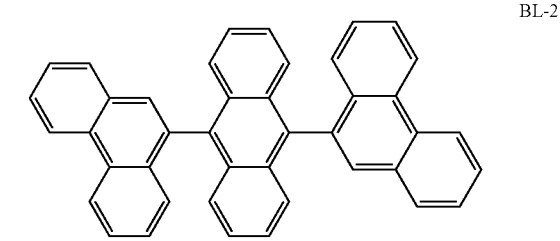
At this time, the method of synthesis of some parts (BL-1, BL-25) of the hole blocking material as shown in formulae 3 will be described.
2. Synthesis of 1,4-Diphenanthrylbenzene (BL-01)
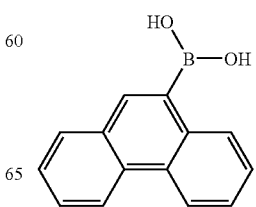 +

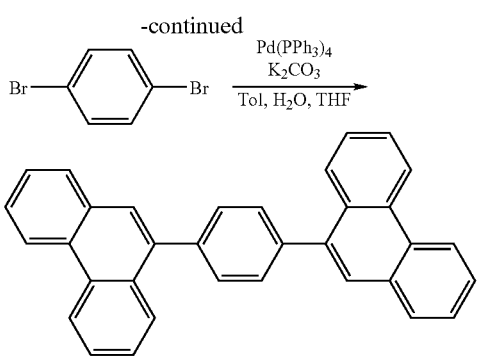

In a two-neck round bottom flask, phenanthryl boronic acid (6.3 g, 0.028 mol), 1,4-dibromo benzene (2.68 g, 0.01 mol), Tetrakis(triphenylphosphine)palladium(0)(0.19 g, 0.05 eq), and potassium carbonate (6.21 g, 0.045 mol) were dissolved in toluene (80 ml), THF(50 mL) and water(50 mL), and stirred for 24 hours in a 100° C. container. After reaction, THF and toluene were removed, and the reaction was extracted using dichloromethane and water, distilled under vacuum, and purified through silica gel column chromatography. Then, the solvent was distilled under vacuum and recrystallized using dichloromethane and methanol and filtered off, thereby obtaining a product, i.e., a white solid of 1,4-diphenanthrylbenzene (3.57 g, 73%).

3. Synthesis of 1.4-diphenathrylquinoline (BL-25)

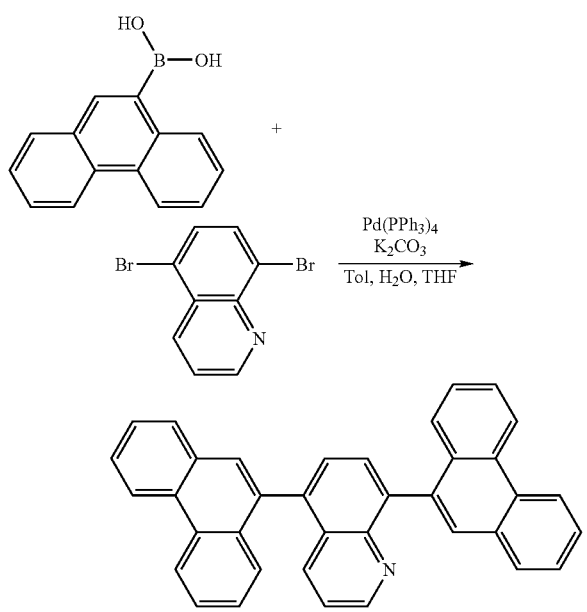

In a two-neck round bottom flask, phenanthryl boronic acid (3.25 g, 0.015 mol), 1,4-dibromo benzene (1.4 g, 0.005 mol), Tetrakis(triphenylphosphine)palladium(0)(0.1 g, 0.05 eq), and potassium carbonate (3.36 g, 0.025 mol) were dissolved in toluene (40 ml), THF(20 mL) and water(20 mL), and stirred for 24 hours in a 100° C. container. After reaction, THF and toluene were removed, and the reaction was extracted using dichloromethane and water, distilled under vacuum, and purified through silica gel column chromatography. Then, the solvent was distilled under vacuum and recrystallized using dichloromethane and methanol and filtered off, thereby obtaining a product, i.e., a white solid of 1,4-diphenanthrylbenzene (1.61 g, 69%).

Hereinafter, examples of the organic electroluminescence according to the present invention and the corresponding driving voltage and luminescence characteristics will be described below.

The luminescence showed 2,625 cd/m² (8.16V) at 1 mA, where x and y are 0.286 and 0.628, respectively, on CIE chromaticity diagram.

EXAMPLE 2

An ITO glass was patterned to have a luminescence area of 3mm×3 mm, and then washed.

Then, the substrate is mounted to a vacuum chamber, the base pressure was set to $1 \times 10^{-6}$ Torr, and then organic materials were deposited on the ITO in the order of HIL(600Å)/NPD(300Å)/CBP+Ir(ppy)$_3$(8%)(200Å)/BL-25(100Å)(hole blocking layer)/Alq$_3$(300Å)/LiF(5Å)/Al(1000Å).

The luminescence showed 3,209 cd/m² (8.18V) at 1 mA, where x and y are 0.287 and 0.627, respectively, on CIE chromaticity diagram.

Comparative Example

An ITO glass was patterned to have a luminescence area of 3 mm×3 mm, and then washed.

Then, the substrate is mounted to a vacuum chamber, the base pressure was set to $1 \times 10^{-6}$ Torr, and then organic materials were deposited on the ITO in the order of HIL(600Å)/NPD(300Å)/CBP+Ir(ppy)$_3$(8%)(200Å)/BAlq(100Å)(hole blocking layer)/Alq$_3$(300Å)/LiF(5Å)/Al(1000Å).

The luminescence showed 2,893 cd/m² (9.73V) at 1 mA, where x and y are 0.318 and 0.617, respectively, on CIE chromaticity diagram. The structural formula of CuPC, NPB, CBP, Ir(ppy)$_3$, BAlq and Alq$_3$ was expressed below.

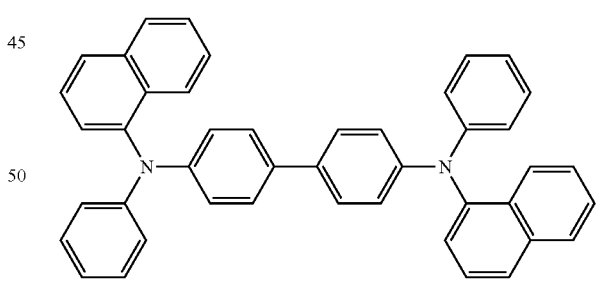

NPD

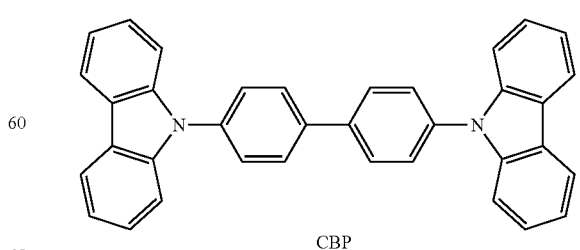

CBP

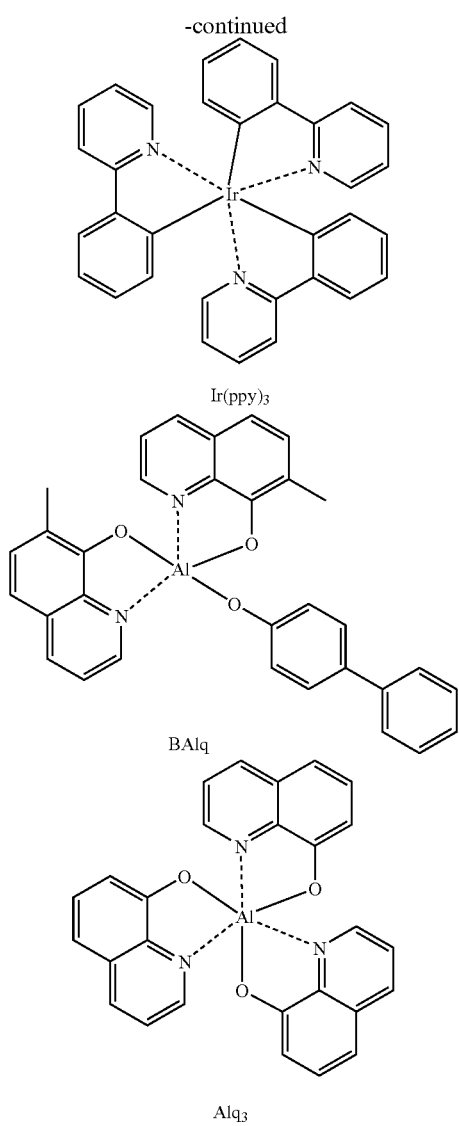

Ir(ppy)₃

BAlq

Alq₃

At this time, in Examples 1 and 2 according to the present invention, BL-1 and BL-25 were used as the hole blocking layer, respectively. In the prior art illustrated by way of Comparative Example, BAlq was used as the hole blocking layer. It can be known that Examples of the present invention are superior in luminescence and driving characteristics than Comparative Example.

Accordingly, the organic electroluminescence device according to the present invention can solve the prior art extinction problem completely and improve the luminescence and driving characteristics by forming a hole blocking layer of a material having an excellent stability, as shown in the aforementioned chemical formulae 3, between an electron injecting electrode and a hole injecting electrode.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. An organic electroluminescence device, comprising an emitting layer and a hole blocking layer disposed between an electron injecting electrode (cathode) and a hole injecting electrode (anode), the material for the hole blocking layer disposed between the electron injecting electrode (cathode) and the emitting layer being expressed by the following chemical formula 1:

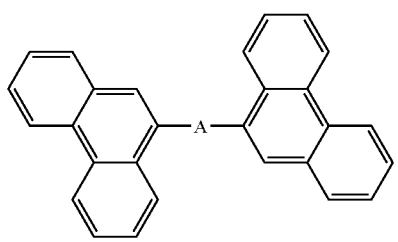

wherein A is selected from the group consisting of pyridyl, quinoline, and isoquinoline, all of which are substituted with a substituent, and wherein the substituent is selected from the group consisting of alkyl, aryl, alkoxy, halogen, and cyano.

2. The device of claim 1, where the substituent is selected from the group consisting of methyl, ethyl, isopropyl, phenyl, naphthyl, methoxy, ethoxy, fluoro, chloro, and cyano.

3. An organic electroluminescence device, comprising an emitting layer and a hole blocking layer disposed between an electron injecting electrode (cathode) and a hole injecting electrode (anode), the material for the hole blocking layer disposed between the electron injecting electrode (cathode) and the emitting layer being expressed by one of the following chemical formulae 3:

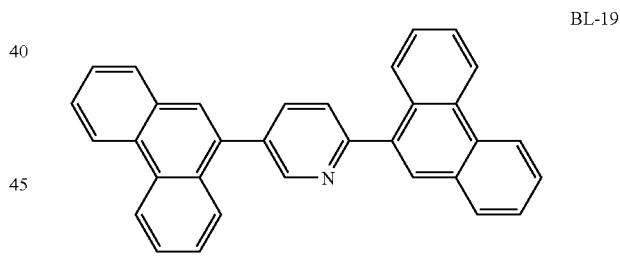

BL-19

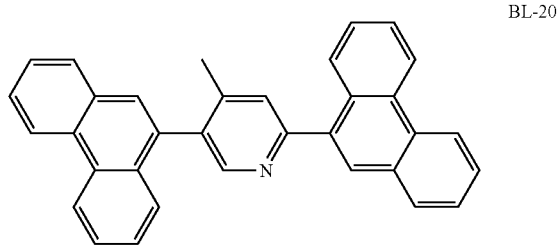

BL-20

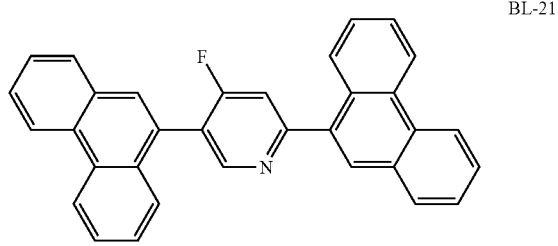

BL-21

-continued

BL-22
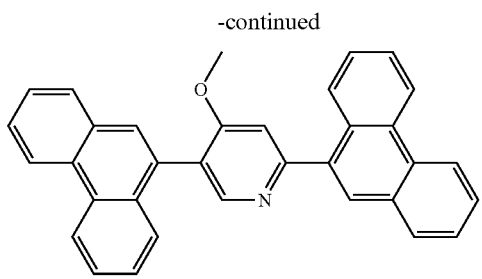

BL-23
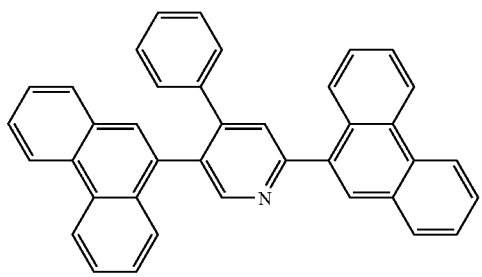

BL-24
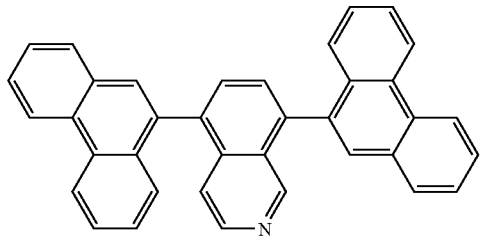

-continued

BL-25
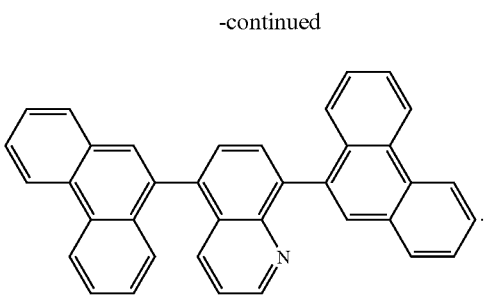

4. An organic electroluminescence device comprising an emitting layer and a hole blocking layer disposed between an electron injecting electrode (cathode) and a hole injecting electrode (anode), the material for the hole blocking layer disposed between the electron injecting electrode (cathode) and the emitting layer being expressed by the following chemical formula 1:

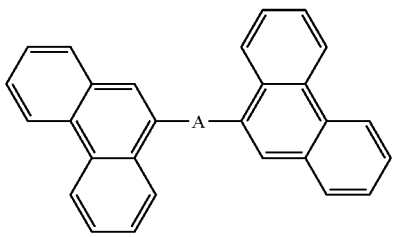

wherein A is selected from the group consisting of naphthyl, which is substituted with a substituent, and wherein the substituent is selected from the group consisting of alkyl, aryl, alkoxy, halogen, and cyano.

* * * * *